(12) United States Patent
Borkenhagen et al.

(10) Patent No.: US 7,672,105 B2
(45) Date of Patent: Mar. 2, 2010

(54) PRODUCTION OF LIMITED LIFETIME DEVICES ACHIEVED THROUGH E-FUSES

(75) Inventors: John M. Borkenhagen, Rochester, MN (US); William P. Hovis, Rochester, MN (US); Daniel P. Kolz, Rochester, MN (US); Jack A. Mandelman, Flat Rock, NC (US)

(73) Assignee: International Business Machines Corporation, Armonk, NY (US)

( * ) Notice: Subject to any disclaimer, the term of this patent is extended or adjusted under 35 U.S.C. 154(b) by 700 days.

(21) Appl. No.: 11/467,749

(22) Filed: Aug. 28, 2006

(65) Prior Publication Data

US 2008/0061816 A1 Mar. 13, 2008

(51) Int. Cl.
*H02H 7/00* (2006.01)
(52) U.S. Cl. ...................................... 361/93.1
(58) Field of Classification Search ................. 361/93.1
See application file for complete search history.

(56) References Cited

U.S. PATENT DOCUMENTS

| | | | | |
|---|---|---|---|---|
| 5,517,265 A | * | 5/1996 | Zander et al. | 396/6 |
| 5,588,637 A | * | 12/1996 | Carsten et al. | 251/129.03 |
| 6,785,629 B2 | * | 8/2004 | Rickes et al. | 702/118 |
| 6,809,972 B2 | * | 10/2004 | Lehmann et al. | 365/200 |
| 7,164,238 B2 | * | 1/2007 | Kazanov et al. | 315/209 SC |

\* cited by examiner

*Primary Examiner*—Stephen W Jackson
(74) *Attorney, Agent, or Firm*—Bockhop & Associates LL

(57) ABSTRACT

An apparatus for disabling a circuit when the circuit is in a first preselected condition includes a critical element that has an enable state and a disable state. The critical element is configured in relation to the circuit such that the circuit cannot operate normally if the critical element is in the disable state. A trigger generates a state signal that causes the critical element to enter the disable state when a comparison of a current condition to a stored value indicates that the circuit is in the first preselected condition. In a method of controlling operation of a circuit, a current condition is sensed. Whether the current condition corresponds to a stored value is determined. If the current condition corresponds to the stored value, then a critical element is caused to enter a disable state so that the circuit is prevented from operating normally.

15 Claims, 2 Drawing Sheets

PRODUCTION OF LIMITED LIFETIME DEVICES ACHIEVED THROUGH E-FUSES

BACKGROUND OF THE INVENTION

1. Field of the Invention

The present invention relates to electronic circuits and, more specifically, to an electronic circuit that may be selectively disabled.

2. Description of the Prior Art

Many modern semiconductor chips have long service lifetimes and low rates of failure. In most applications, this is a desirable quality. However, in certain applications it is more desirable for a chip to have a limited or controllable service life. For example, many electronics companies provide evaluation copies of their circuits to potential customers to allow the customers to evaluate the circuits. Once the evaluation period has ended, the company providing the circuit usually has to rely on the good faith of the potential customer to return or destroy the circuit. In another example, chips used in military hardware that is transferred to certain foreign forces whose long term loyalty cannot be assured should be capable of being disabled once the time for their intended purposes had passed.

There is also a concern that users of certain circuits might to tamper with the circuits to use them for unauthorized purposes. The most common way of trying to prevent such tampering is to place a sticker on the housing for the circuit with a warning that tampering will void the warranty. This approach may be ineffective in many cases.

Therefore, there is a need for a circuit that can be disabled when the user is attempting to use the circuit outside of normal operating conditions.

SUMMARY OF THE INVENTION

The disadvantages of the prior art are overcome by the present invention which, in one aspect, is an apparatus for disabling a circuit when the circuit is in a first preselected condition. The apparatus includes a critical element that has an enable state and a disable state. The critical element is configured in relation to the circuit such that the circuit cannot operate normally if the critical element is in the disable state. A trigger that generates a state signal that causes the critical element to enter the disable state when a comparison of a current condition to a stored value indicates that the circuit is in the first preselected condition.

In another aspect, the invention is a method of controlling operation of a circuit, in which a current condition is sensed. Whether the current condition corresponds to a stored value is determined. If the current condition corresponds to the stored value, then a critical element is caused to enter a disable state so that the circuit is prevented from operating normally.

These and other aspects of the invention will become apparent from the following description of the preferred embodiments taken in conjunction with the following drawings. As would be obvious to one skilled in the art, many variations and modifications of the invention may be effected without departing from the spirit and scope of the novel concepts of the disclosure.

DETAILED DESCRIPTION OF THE INVENTION

Figure 1:
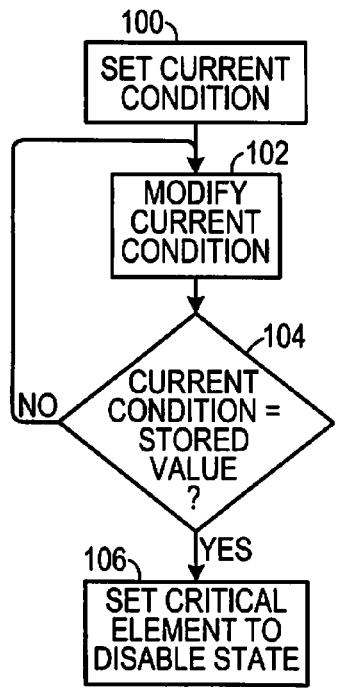
FIG. 1 is a flow chart showing one method of disabling a circuit.

A preferred embodiment of the invention is now described in detail. Referring to the drawings, like numbers indicate like parts throughout the views. As used in the description herein and throughout the claims, the following terms take the meanings explicitly associated herein, unless the context clearly dictates otherwise: the meaning of "a," "an," and "the" includes plural reference, the meaning of "in" includes "in" and "on."

In one embodiment of the invention, a circuit includes a mechanism that disables the circuit in situations in which the entity that made the circuit desires that the circuit not be used. The circuit includes a critical element that has an enable state, which allows the circuit to operate normally, and a disable state, which prevents normal operation of the circuit. Generally, the circuit will be enabled by an initial event, such as a first use of the circuit, an activation input by the user, or even the passing of a predetermined time or date. As shown in FIG. 1, initially the critical element is in the enabled state and a current condition is set 100 (e.g., a counter is set to zero). The current condition is modified 102 (e.g., the counter is incremented) and then the current condition is compared to a stored value 104 (e.g., the counter is compared to a maximum lifetime count for the circuit). If the current condition equals the stored value, then the critical element is set into a disable state 106, thereby disabling the circuit. Otherwise the system loops back to the modification step 102.

Figure 2:
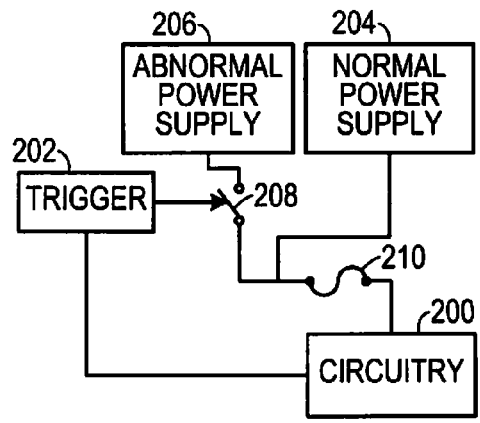
FIG. 2 is a block diagram showing a first embodiment.

The hardware used to embody the invention may take many forms. For example, as shown in FIG. 2, the critical element may take the form of a fuse 210 that couples a power supply 204 to the circuit 200. A switch 208 selectively couples an abnormal power supply 206 to the fuse 210 such that if the switch 208 is closed, then the fuse will blow and the circuit 200 will become inoperable. A triggering element 202 controls the switch 208. The triggering element 202 could include an output from the circuit 200, which runs software following the method disclosed in FIG. 1.

Figure 3:
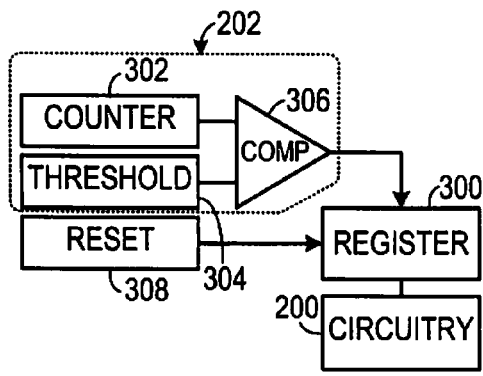
FIG. 3 is a block diagram showing a second embodiment.

As shown in FIG. 3, the triggering element 202 can include a counter 302 and a comparator 306 that compares a current value of the counter 302 to a threshold value 304 (that could be hard wired or that could be stored in a memory). The critical element could be a bit in a register 300 that, when set, prevents the circuit 200 from operating normally. For example, when the bit is set, the circuit 200 could cause an error message to be displayed, or it could simply cause the circuit 200 to cease working or to output erroneous data. When the circuit 200 is activated, the counter 302 is started and when it reaches the threshold value 304 the comparator 306 asserts a signal that sets the bit in the register 300 that disables the circuit 200. The register 300 may also be provided with a reset input, which may be driven by a reset circuit 308 (which could be embedded in the circuit 200 and be driven by a reset software routine). The reset would allow the circuit 200 to be re-enabled in cases such as when a customer pays a subscription renewal fee.

Figure 4:
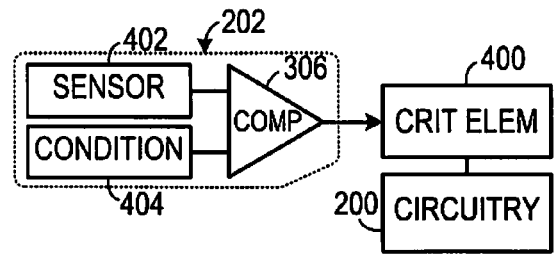
FIG. 4 is a block diagram showing a third embodiment.

As shown in FIG. 4, the triggering element 202 could include a sensor 402 (for example a GPS receiver) that detects an environmental condition (such as the location of the circuit 200, relative to a predetermined geographic boundary, and the comparator 306 compares the output from the sensor 402 to a condition stored in memory 404. When the condition matches the output, the comparator 306 triggers the critical element 400. This embodiment could be used to ensure that the circuit 200 is not being used in unauthorized locations. If the sensor 402 were chemical sensor, for example, then the invention could used as a safety device to ensure that the circuit 200 is not being used in a hazardous environment.

Figure 5:
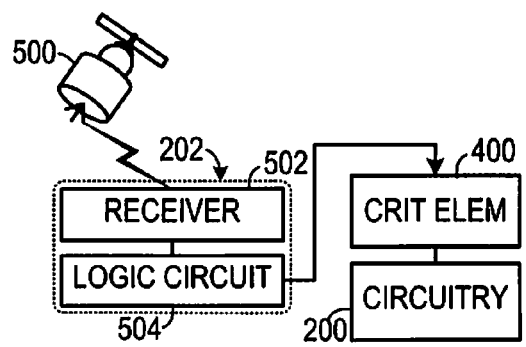
FIG. 5 is a block diagram showing a fourth embodiment.

As shown in FIG. 5, in one embodiment the triggering element 202 could employ a receiver 502 that is configured to receive signals from a signal source, such as a satellite 500. When a signal having a predetermined value is received, a logic circuit 504 asserts a disable signal that causes the critical element 400 to enter the disable state. This embodiment could be used in many applications. For example, it could be used to disable the circuit if a licensor of hardware has not renewed a subscription or has failed to meet a contractual obligation. This embodiment could also be used to re-enable the circuit, by sending a second predetermined signal value from the satellite 500. This could be useful to limit circuit operation only to certain predetermined times. For example, it could be used to ensure that fleet vehicles are used only during normal working hours.

Figure 6:
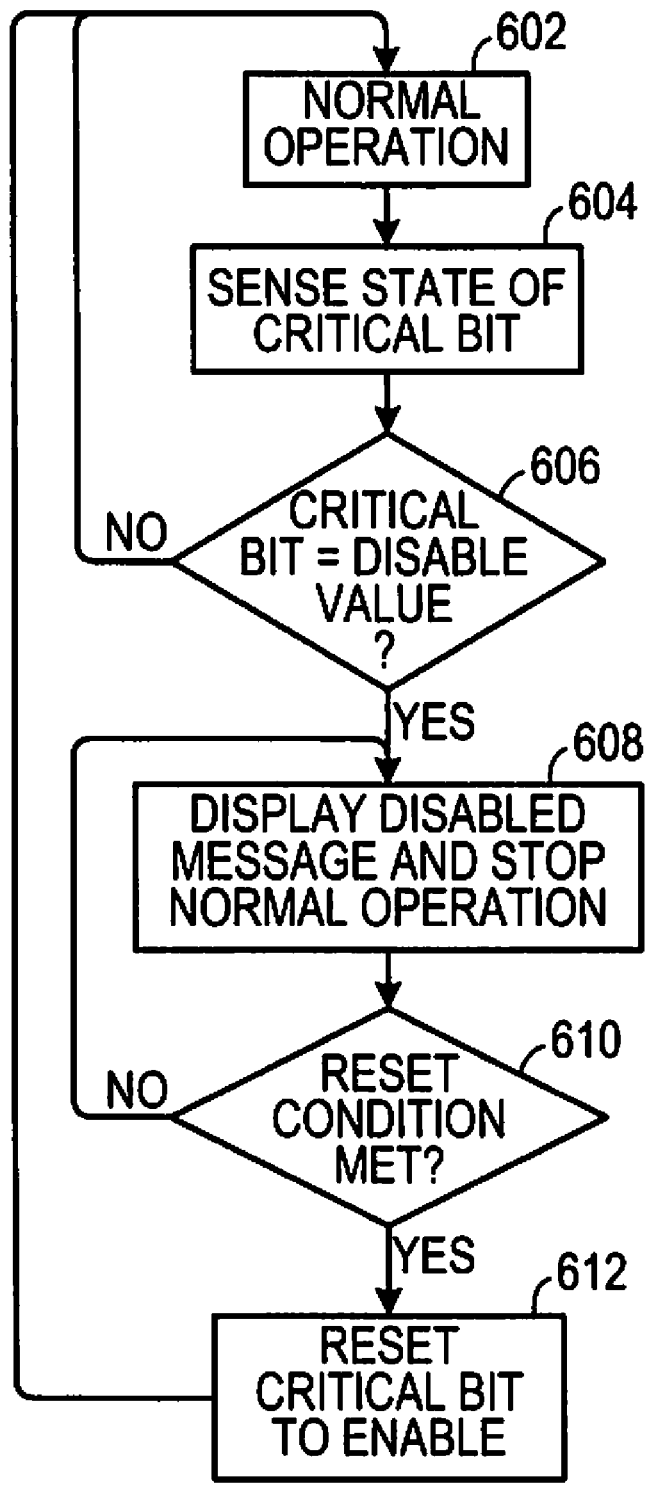
FIG. 6 is a flow chart showing one method of disabling a circuit and displaying an error message.

One method for controlling operation of a system employing a critical bit register, as described above, is shown in FIG. 6. Generally, the circuit operates normally 602, but periodically senses the state of the critical bit 604. If the critical bit indicates that it has not been set to a disable state 606, then the system returns to normal operation 602. Otherwise, the system stops normal operation and (optionally) displays a disabled message 608. While in the disabled state, the circuit could shut down completely or, alternatively, it could execute only a limited set of operations. However, while in the disabled state, the circuit would be prevented from executing normal operations. In an extreme case, as might be desirable in a circuit that in which tamper resistance is important, it could execute a self-destruct sequence at this stage. In a situation where the critical bit is provided with a reset capability, the system determines if a reset condition has been met 610. If not, the system returns to step 608 and continues in the abnormal operation state. Otherwise, the system resets the critical bit to the enabled state 612 and control passes back to the normal operation state 602.

The above described embodiments, while including the preferred embodiment and the best mode of the invention known to the inventor at the time of filing, are given as illustrative examples only. It will be readily appreciated that many deviations may be made from the specific embodiments disclosed in this specification without departing from the spirit and scope of the invention. Accordingly, the scope of the invention is to be determined by the claims below rather than being limited to the specifically described embodiments above.

What is claimed is:

1. An apparatus for disabling a circuit when the circuit is in a first preselected condition, comprising:
   a. a critical element that has an enable state and a disable state, the critical element configured in relation to the circuit such that the circuit cannot operate normally if the critical element is in the disable state; and
   b. a trigger that generates a state signal that causes the critical element to enter the disable state when a comparison of a current condition to a stored value indicates that the circuit is in the first preselected condition,
   wherein the critical element comprises a register that includes a bit that is configured relative to the circuit such that when the bit is in a first state then the critical element is in the enable state and when the bit is in a second state then the critical element is in the disable state.

2. The apparatus of claim 1, further comprising a reset unit that resets the critical element to the enable state, such that the circuit can operate normally, when the circuit is an a second preselected condition.

3. The apparatus of claim 1, wherein the critical element comprises a fuse that couples a power supply to the circuit, the apparatus farther comprising a switch that selectively couples the fuse to an abnormal power supply, the abnormal power supply capable of causing fuse to blow when coupled to the abnormal power supply.

4. An apparatus for disabling a circuit when the circuit is in a first preselected condition, comprising:
   a. a critical element that has an enable state and a disable state, the critical element configured in relation to the circuit such that the circuit cannot operate normally if the critical element is in the disable state;
   b. a trigger that generates a state signal that causes the critical element to enter the disable state when a comparison of a current condition to a stored value indicates that the circuit is in the first preselected condition; and
   c. a counter that begins counting upon an occurrence of an initial event, wherein the trigger comprises:
      i. a memory that stores a threshold value; and
      ii. a comparator that compares a current value of the counter to the threshold value and that generates the state signal when the current value corresponds to the threshold value.

5. The apparatus of claim 4, wherein the initial event comprises a first use of the circuit.

6. The apparatus of claim 4, wherein the initial event comprises activating the circuit by the user.

7. The apparatus of claim 4, wherein the initial event comprises passing a predetermined time event.

8. An apparatus for disabling a circuit when the circuit is in a first preselected condition, comprising:
   a. a critical element that has an enable state and a disable state, the critical element configured in relation to the circuit such that the circuit cannot operate normally if the critical element is in the disable state; and
   b. a trigger that generates a state signal that causes the critical element to enter the disable state when a comparison of a current condition to a stored value indicates that the circuit is in the first preselected condition, wherein the trigger comprises a sensor that senses an environmental condition.

9. The apparatus of claim 8, wherein the environmental condition comprises a location of the circuit.

10. The apparatus of claim 8, wherein the trigger comprises:
    a. a receiver that receives a remote signal from a remote source, wherein the environmental condition comprises a state of the remote signal; and
    b. a logic circuit that asserts the state signal so as to cause the critical element to enter the disable state when the remote signal has a first predetermined value.

11. The apparatus of claim 10, wherein the logic circuit asserts the state signal so as to cause the critical element to enter the enable state when the remote signal has a second predetermined value, different from the first predetermined value.

12. The apparatus of claim 4, further comprising a reset unit that resets the critical element to the enable state, such that the circuit can operate normally, when the circuit is an a second preselected condition.

13. The apparatus of claim 4, wherein the critical element comprises a fuse that couples a power supply to the circuit, the apparatus further comprising a switch that selectively couples the fuse to an abnormal power supply, the abnormal power supply capable of causing fuse to blow when coupled to the abnormal power supply.

14. The apparatus of claim 8, further comprising a reset unit that resets the critical element to the enable state, such that the circuit can operate normally, when the circuit is an a second preselected condition.

15. The apparatus of claim 8, wherein the critical element comprises a fuse that couples a power supply to the circuit, the apparatus further comprising a switch that selectively couples the fuse to an abnormal power supply, the abnormal power supply capable of causing fuse to blow when coupled to the abnormal power supply.

* * * * *